(12) United States Patent
Akiyama et al.

(10) Patent No.: US 9,834,853 B2
(45) Date of Patent: Dec. 5, 2017

(54) PZT PRECURSOR SOLUTION, METHOD FOR PRODUCING PZT PRECURSOR SOLUTION, METHOD FOR PRODUCING PZT FILM, METHOD FOR PRODUCING ELECTROMECHANICAL TRANSDUCER ELEMENT, AND METHOD FOR PRODUCING LIQUID DISCHARGE HEAD

(71) Applicants: Yoshikazu Akiyama, Kanagawa (JP); Akira Shimofuku, Kanagawa (JP); Keiji Ueda, Kanagawa (JP)

(72) Inventors: Yoshikazu Akiyama, Kanagawa (JP); Akira Shimofuku, Kanagawa (JP); Keiji Ueda, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/382,952

(22) Filed: Dec. 19, 2016

(65) Prior Publication Data
US 2017/0211202 A1    Jul. 27, 2017

(30) Foreign Application Priority Data
Jan. 22, 2016   (JP) .................................. 2016-010941

(51) Int. Cl.
| H01L 21/00 | (2006.01) |
| C30B 1/02 | (2006.01) |
| C30B 29/32 | (2006.01) |
| C23C 14/24 | (2006.01) |
| C23C 14/34 | (2006.01) |
| B41J 2/16 | (2006.01) |
| H01L 41/187 | (2006.01) |
| H01L 41/39 | (2013.01) |
| H01L 41/113 | (2006.01) |

(Continued)

(52) U.S. Cl.
CPC ............... *C30B 1/023* (2013.01); *B41J 2/162* (2013.01); *B41J 2/1646* (2013.01); *C23C 14/24* (2013.01); *C23C 14/34* (2013.01); *C30B 29/32* (2013.01); *H01L 41/113* (2013.01); *H01L 41/1876* (2013.01); *H01L 41/29* (2013.01); *H01L 41/318* (2013.01); *H01L 41/39* (2013.01)

(58) Field of Classification Search
CPC ... H01L 41/18; H01L 41/318; H01L 41/0478; H01L 41/0805; H01L 41/0815; B41J 2/161; B41J 2/1645
USPC ..................................................... 438/21, 39
See application file for complete search history.

(56) References Cited

U.S. PATENT DOCUMENTS

| 6,147,438 A * | 11/2000 | Nishiwaki ........... H01L 41/0973 |
| | | 310/363 |
| 7,059,709 B2 | 6/2006 | Kobayashi et al. |
| 8,080,230 B2 | 12/2011 | Auer et al. |

(Continued)

FOREIGN PATENT DOCUMENTS

| JP | S60-236404 | 11/1985 |
| JP | 2004-107179 | 4/2004 |

(Continued)

*Primary Examiner* — Brook Kebede
(74) *Attorney, Agent, or Firm* — IPUSA, PLLC

(57) ABSTRACT

A PZT precursor solution is used for forming a PZT film by a sol-gel method. The PZT precursor solution includes a solvent; a component that forms a crystal of PZT by crystallization, the component being dissolved in the solvent; and an element that inhibits crystal growth of PZT, the element being dissolved in the solvent.

10 Claims, 11 Drawing Sheets

(51) Int. Cl.
*H01L 41/29* (2013.01)
*H01L 41/318* (2013.01)

(56) References Cited

U.S. PATENT DOCUMENTS

| | | |
|---|---|---|
| 8,425,026 B2 | 4/2013 | Machida et al. |
| 8,646,180 B2 | 2/2014 | Akiyama et al. |
| 8,684,493 B2 | 4/2014 | Tajima et al. |
| 8,690,297 B2 | 4/2014 | Ueda et al. |
| 8,727,505 B2 | 5/2014 | Mizukami et al. |
| 8,727,509 B2 | 5/2014 | Shimofuku et al. |
| 9,085,145 B2 | 7/2015 | Shimofuku et al. |
| 9,196,821 B2 | 11/2015 | Aoyama et al. |
| 2004/0129917 A1 | 7/2004 | Kubota et al. |
| 2012/0276303 A1 | 11/2012 | Watanabe et al. |
| 2012/0314007 A1* | 12/2012 | Shimofuku ............ B41J 2/161 347/71 |
| 2013/0250009 A1* | 9/2013 | Ishimori ............ H01L 41/0805 347/70 |
| 2014/0049582 A1 | 2/2014 | Machida et al. |
| 2014/0268481 A1 | 9/2014 | Akiyama et al. |
| 2014/0340854 A1 | 11/2014 | Akiyama et al. |
| 2015/0070444 A1 | 3/2015 | Ishimori et al. |
| 2015/0145924 A1 | 5/2015 | Shimofuku et al. |
| 2015/0263263 A1 | 9/2015 | Akiyama et al. |
| 2016/0049579 A1 | 2/2016 | Shimofuku et al. |
| 2016/0221033 A1 | 8/2016 | Akiyama et al. |

FOREIGN PATENT DOCUMENTS

| | | |
|---|---|---|
| JP | 2004-107181 | 4/2004 |
| JP | 2008-522946 | 7/2008 |

* cited by examiner

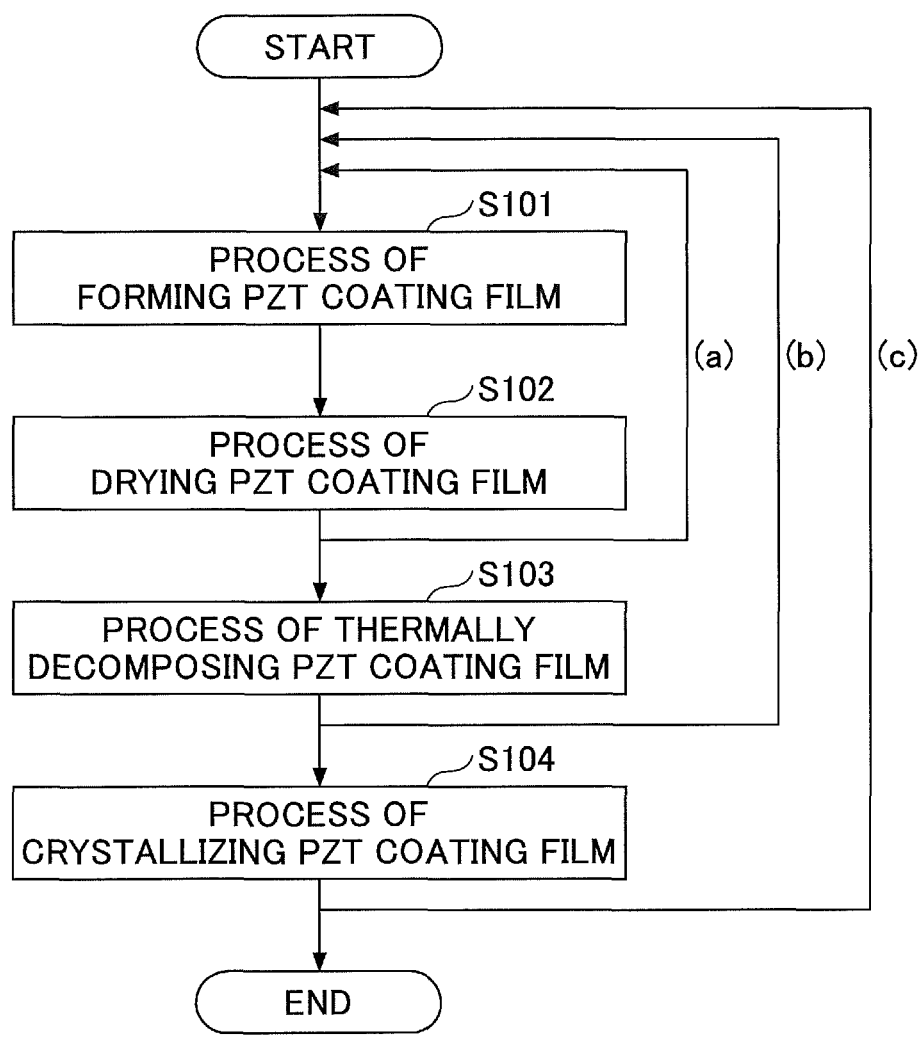

PZT PRECURSOR SOLUTION, METHOD FOR PRODUCING PZT PRECURSOR SOLUTION, METHOD FOR PRODUCING PZT FILM, METHOD FOR PRODUCING ELECTROMECHANICAL TRANSDUCER ELEMENT, AND METHOD FOR PRODUCING LIQUID DISCHARGE HEAD

BACKGROUND OF THE INVENTION

1. Field of the Invention

The present disclosure relates to a PZT precursor solution, a method for producing a PZT precursor solution, a method for producing a PZT film, a method for producing an electromechanical transducer element, and a method for producing a liquid discharge head.

2. Description of the Related Art

An inkjet head has been known such that a part of a pressure generating chamber that communicates with a nozzle opening for discharging ink is formed of an oscillation plate, and the oscillation plate is deformed by a piezoelectric element to apply pressure to ink inside the pressure chamber, so that the ink can be discharged from the nozzle opening. For this inkjet head, two types of piezoelectric actuators have been implemented so far, which are a piezoelectric actuator that expands and contracts in an axis direction of a piezoelectric element, and a piezoelectric actuator that utilizes bending force. As a piezoelectric film that utilizes bending force, a film of lead zirconate titanate (which is referred to as PZT, hereinafter) has been suitably used. The film of lead zirconate titanate is referred to as the PZT film, hereinafter.

A lower electrode is formed on a silicon wafer, and the PZT film is formed on the lower electrode, for example. Furthermore, by application of a known Micro Electro Mechanical System (MEMS) process to the silicon wafer on which the lower electrode and the PZT film are formed, the silicon wafer can be processed into an inkjet head and used. Usually, a film thickness of the PZT film is approximately from 1 micron through 3 microns.

To achieve a stable ink discharge property, which is one of properties required for the inkjet head, a PZT film superior in a characteristic of electromechanical energy conversion is required. Note that, in general, the characteristic of electromechanical energy conversion is referred to as a piezoelectric characteristic. In order to achieve enhancement of the piezoelectric characteristic, various types of film forming methods have been proposed, such as the sol-gel method, the sputtering method, and the chemical vapor deposition (CVD) method (cf. Patent Document 1 (Japanese Unexamined Patent Publication No. S60-236404)).

SUMMARY OF THE INVENTION

According to an aspect of the present invention, there is provided a PZT precursor solution to be used for forming a PZT film by a sol-gel method, the PZT precursor solution including a solvent; a component that forms PZT by crystallization, the component being dissolved in the solvent; and an element that inhibits crystal growth of PZT, the element being dissolved in the solvent.

Other objects, features and advantages of the present invention will become more apparent from the following detailed description when read in conjunction with the accompanying drawings.

BRIEF DESCRIPTION OF THE DRAWINGS

FIG. 4 is a diagram illustrating a method of thickening a PZT film;

DETAILED DESCRIPTION OF THE PREFERRED EMBODIMENTS

Figure 1:
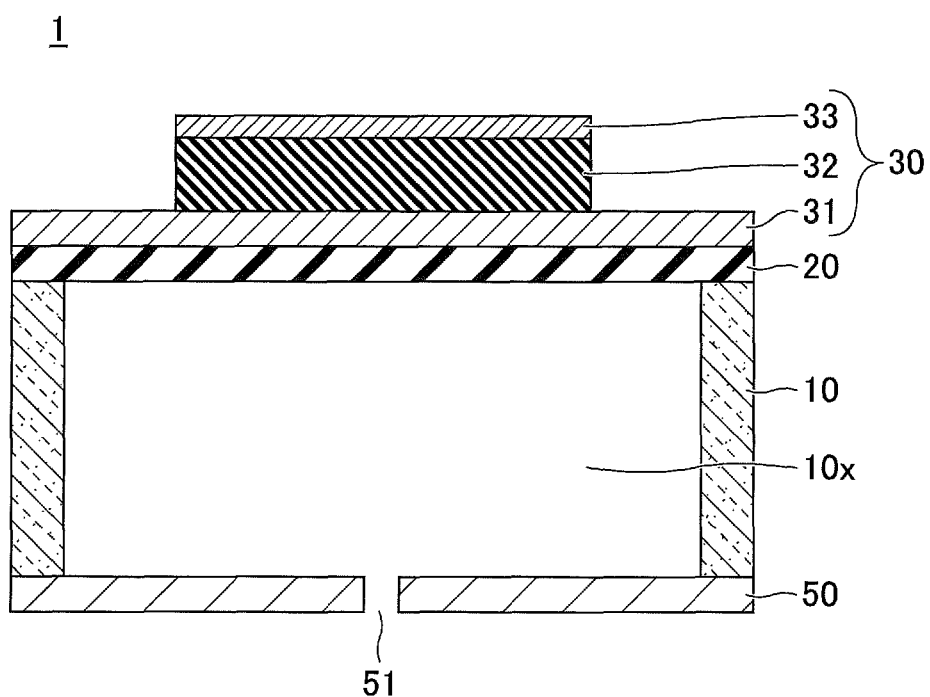
FIG. 1 is a cross-sectional view (version 1) exemplifying a liquid discharge head according to an embodiment.

When a plurality of PZT films is formed on a wafer, a displacement characteristic may differ between an edge of the wafer and a center of the wafer (so-called "intra-plane distribution of the displacement characteristic").

A size of one element to be an inkjet head is about 1 inch×0.6 inch. It is preferable that more elements can be cut out from one wafer so as to reduce the manufacturing cost.

When inkjet heads are manufactured by cutting out many elements from a wafer having the intra-plane distribution of the displacement characteristic, a performance variation among the obtained heads may be large, which results in an increase in the cost due to decrease in a yield rate and occurrence of defective products. There is a need for reducing the intra-plane distribution of the displacement characteristic.

However, the intra-plane distribution of the displacement characteristic may not be reduced by the film forming methods proposed so far, which focus on enhancing the piezoelectric characteristic.

There is a need for a PZT precursor solution that can reduce the intra-plane distribution of the displacement characteristic.

According to a disclosed technique, a PZT precursor solution can be provided that can reduce the intra-plane distribution of the displacement characteristic.

An embodiment for implementing the present invention is described below by referring to the accompanying drawings. In the drawings, the same or corresponding reference numerals may be attached to the same or corresponding configurations, and duplicate descriptions may be omitted.

In the embodiment, a PZT precursor solution to be used for forming a PZT film by the sol-gel method and a method for producing the PZT precursor solution are mainly described. Before that, a structure of a liquid discharge head, a method for producing the liquid discharge head, and the "intra-plane distribution of the displacement characteristic" in the liquid discharge head are described.

<Structure and Method for Producing the Liquid Discharge Head>

FIG. 1 is a cross-sectional view exemplifying a liquid discharge head according to the embodiment. Referring to FIG. 1, the liquid discharge head 1 includes a substrate 10; an oscillation plate 20; an electromechanical transducer element 30; and a nozzle plate 50. The electromechanical transducer element 30 includes a lower electrode 31; an electromechanical transducer film 32; and an upper electrode 33.

In the liquid discharge head 1, the oscillation plate 20 is formed on the substrate 10; and the lower electrode 31 of the electromechanical transducer element 30 is formed on the oscillation plate 20. The electromechanical transducer film 32 is formed in a predetermined area on the lower electrode 31; and, additionally, the upper electrode 33 is formed on the electromechanical transducer film 32.

The nozzle plate 50 provided with a nozzle 51 for discharging ink droplets is bonded to a lower portion of the substrate 10. A pressure chamber 10x (which may be referred to as an ink flow channel, a pressure liquid chamber, a pressurizing chamber, a discharge chamber, and a liquid chamber) is formed by the nozzle plate 50, the substrate 10, and the oscillation plate 20. Here, the pressure chamber 10x communicates with the nozzle 51. The oscillation plate 20 forms a part of a wall surface of the ink flow channel. In other words, the pressure chamber 10x is partitioned by the substrate 10 (which forms the side surface), the nozzle plate 50 (which forms the lower surface), and the oscillation plate 20 (which forms the upper surface); and the pressure chamber 10x communicates with the nozzle 51.

FIGS. 2A through 2D and FIGS. 3A through 3C are diagrams exemplifying a manufacturing process of the liquid discharge head 1 according to the embodiment, and FIGS. 2A through 2D and FIGS. 3A through 3C respectively illustrate the cross sections, which correspond to the cross section illustrated in FIG. 1.

Figure 2A:
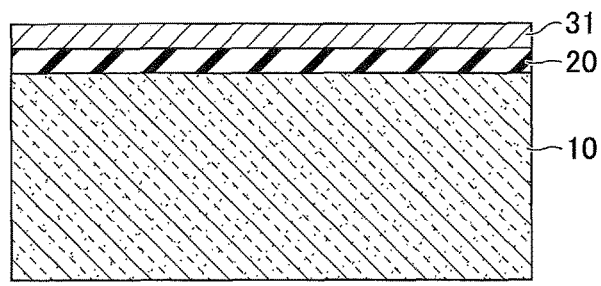
FIGS. 2A-2D are diagrams exemplifying a process of manufacturing the liquid discharge head according to the embodiment.

First, as illustrated in FIG. 2A, the oscillation plate 20 and the lower electrode 31 are sequentially laminated on the substrate 10. As the substrate 10, a silicon single crystal substrate is preferably used, and a thickness of the substrate 10 is preferably from 100 µm through 600 µm. As for the plane orientation, there are three types, which are (100), (110), and (111). In the semiconductor industry, in general, (100) and (111) are widely used. For the liquid discharge head 1, a single crystal substrate that mainly has the (100) plane orientation can be used.

As a material of the oscillation plate, for example, any one of the following can be used: Aluminum oxide, Zirconium oxide, Iridium oxide, Ruthenium oxide, Tantalum oxide, Hafnium oxide, Osmium oxide, Rhenium oxide, Rhodium oxide, Palladium oxide, and a chemical compound of the above-described oxides. The oscillation plate 20 can be formed on the substrate 10, for example, by the sputtering method or the sol-gel method. A film thickness of the oscillation plate 20 is preferably from 1 µm through 3 µm.

As a material of the lower electrode 31, for example, a metal may be used, such as platinum (Pt), gold (Au), and silver (Ag); or a material obtained by laminating a conductive oxide, such as LNO (lanthanum nickelate, $LaNiO_3$) or SRO (strontium ruthenate, $SrRuO_3$), on the above-described metal may be used. The lower electrode 31 can be formed, for example, by a vacuum film deposition method, such as the sputtering method and a vacuum evaporation method. A film thickness of the lower electrode 31 is preferably from 0.05 µm through 1 µm.

Here, a base layer (an adhesive layer) is preferably formed between the oscillation plate 20 and the lower electrode 31. The purpose is to enhance adhesiveness between the oscillation plate 20 and the lower electrode 31. As a material of the base layer, for example, any one of the following may be used: a metal, such as titanium and tantalum; an oxide of the above-described metal, such as titanium oxide and tantalum oxide; and a nitride of the above-described metal, such as titanium nitride and tantalum nitride. The base layer can be formed, for example, by a vacuum film deposition method, such as the sputtering method and a vacuum evaporation method.

Figure 2B:
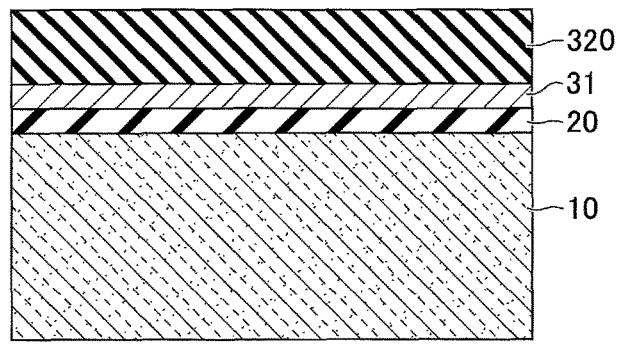
Figure 2C:
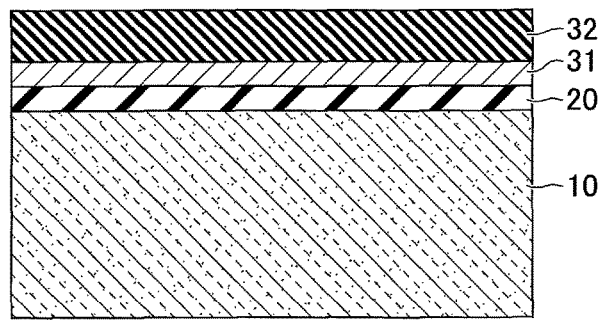

Subsequently, as illustrated in FIG. 2B and FIG. 2C, the electromechanical transducer film 32 is formed on the lower electrode 31. As the electromechanical transducer film 32, lead zirconate titanate (PZT) can be preferably used. Here, PZT is a solid solution of lead zirconate ($PbZrO_3$) and titanic acid ($PbTiO_3$); and characteristics of PZT differ depending on a ratio between $PbZrO_3$ and $PbTiO_3$. For example, PZT may be used in which a ratio between $PbZrO_3$ and $PbTiO_3$ is in a range from 49:51 through 51:49, which can be represented by a chemical formula in a range from $Pb(Zr_{0.49}Ti_{0.51})O_3$ through $Pb(Zr_{0.51}Ti_{0.49})$, or represented, in general, by a range from PZT(49/51) through PZT(51/49).

The PZT film as the electromechanical transducer film 32 can be formed, for example, by the sol-gel method. In the sol-gel method, first, a starting material is dissolved in a common solvent to synthesize a PZT precursor solution (PZT sol-gel solution), which is a homogeneous solvent. Then, as illustrated in FIG. 2B, for example, the synthesized PZT precursor solution is coated on the lower electrode 31 by the spin coating method to form a PZT coating film 320.

Note that a solid content concentration of the PZT precursor solution is preferably adjusted, so that the solid content concentration of the PZT precursor solution is optimized from the relationship between a film formation area of the electromechanical transducer film 32 and a coating amount of the PZT precursor solution in the coating process. The solid content concentration of the PZT precursor solution may be approximately 0.5 mol/L, for example. The PZT precursor solution and the method for producing the PZT precursor solution are described below in detail.

Next, an amorphous film is formed by applying, to the PZT coating film 320, a heating process for drying the solvent and a heating process for thermal decomposition. Furthermore, by applying a heating process for crystallization at a temperature that is higher than the temperature for drying the solvent and the temperature for thermal decomposition, the electromechanical transducer film 32 (the crystallized PZT film) is obtained on the lower electrode 31, as illustrated in FIG. 2C.

The temperature for drying the solvent may be about 200° C., for example. The temperature for thermal decomposition may be about 500° C., for example. The temperature for crystallization may be about 750° C., for example. For the heating process, for example, a heat source device using a hot plate or a clean oven, a rapid thermal annealing (RTA: Rapid Thermal Annealing) device using an infrared lamp, or a laser light irradiation device may be used, as appropriate.

When the PZT coating film 320 transforms into a PZT film, which is the electromechanical transducer film, the volume of the film shrinks. In order to obtain a crack-free film, the PZT precursor solution is preferably adjusted, so that a film with a thickness of approximately from 50 nm through 100 nm can be obtained in a single process. The film thickness of the electromechanical transducer film 32 (the PZT film) obtained by a single process can be adjusted by adjusting the solid content concentration of the PZT precursor solution.

Figure 2D:
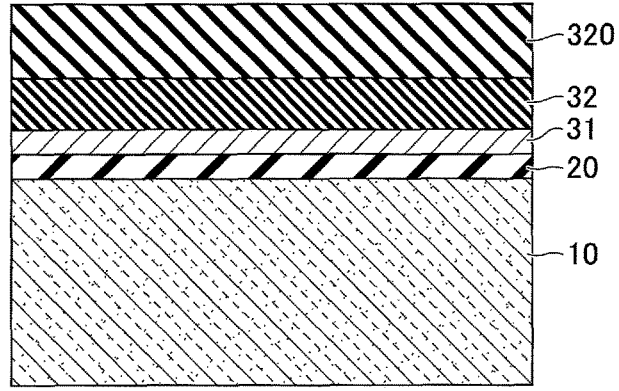
Figure 3A:
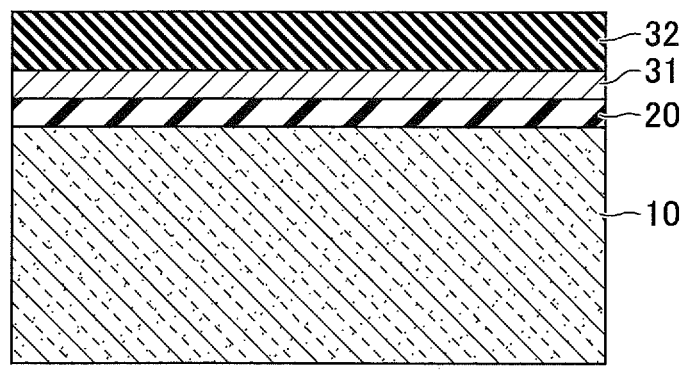
FIGS. 3A-3C are diagrams exemplifying a continuation of the process of manufacturing the liquid discharge head according to the embodiment.

When the PZT film is used as the electromechanical transducer film 32 of the liquid discharge head 1, it is required that the PZT film has a film thickness of approximately from 1 µm through 2 µm, or more. Accordingly, as illustrated in FIG. 2D and FIG. 3A, by repeating the process of FIG. 2B and FIG. 2C a predetermined number of times (e.g., ten or more times), the electromechanical transducer film 32 is thickened to have a film thickness of approximately from 1 μm through 2 μm. By further repeating the process of FIG. 2B and FIG. 2C a predetermined number of times, the electromechanical transducer film 32 may be thickened to have a film thickness of approximately from 10 μm.

Figure 3B:
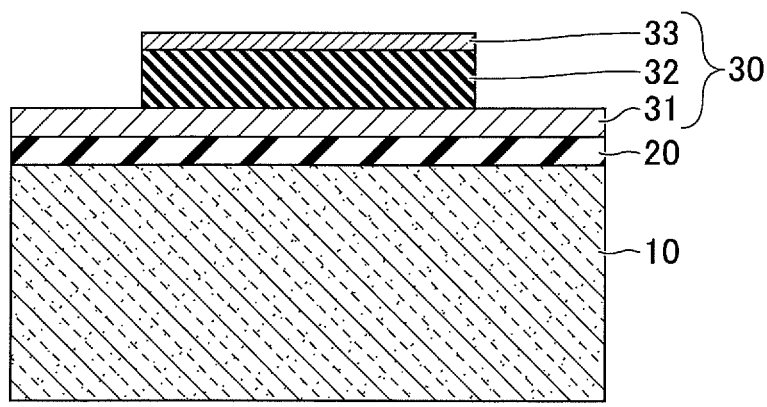

Subsequently, as illustrated in FIG. 3B, the electromechanical transducer film 32 is patterned to have a predetermined shape by photolithography and etching. The electromechanical transducer film 32 can be a long length pattern, for example, with a width of approximately 50 μm, and a length of approximately 1500 μm. After that, by forming the upper electrode 33 on the electromechanical transducer film 32, the electromechanical transducer element 30 is completed. The material, the film thickness, and the forming method of the upper electrode 33 may be the same as the material, the film thickness, and the forming method of the lower electrode 31, for example.

Figure 3C:
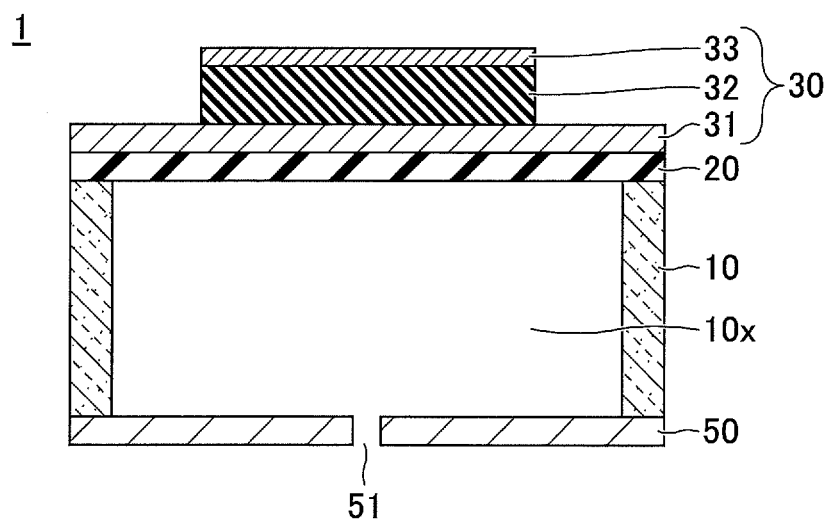

Subsequently, as illustrated in FIG. 3C, the pressure chamber 10x is formed in the substrate 10, and, further, the nozzle plate 50 is bonded to the substrate 10. The pressure chamber 10x can be formed by using anisotropic etching, for example. Note that the anisotropic etching is a method that utilizes a property of a crystal that an etching rate differs depending on a plane orientation of the crystal structure. For example, for anisotropic etching where a substrate is immersed in an alkaline solution, such as KOH, an etching rate for the (111) plane is approximately 1/400 compared to an etching rate for the (100) plane. For the plane orientation (100), a structure with an inclination of approximately 54 degrees can be produced. For the plane orientation (110), deeper grooves can be formed. After forming the pressure chamber 10x, the nozzle plate 50 provided with the nozzle 51 is bonded to the lower surface of the substrate 10, and thereby the liquid discharge head 1 is completed.

Note that, in the manufacturing process illustrated in FIGS. 2A through 2D and FIGS. 3A through 3C, there are a plurality of methods for thickening the PZT film. Examples of the method of thickening the PZT film are briefly described by referring to FIG. 4. In FIG. 4, the arrows (a), (b), and (c) respectively represent reiteration of the process. The reiteration may be performed optionally or at any timing. In FIG. 4, a time point at which the substrate 10, on which the oscillation plate 20 and the lower electrode 31 are sequentially laminated, is prepared is the start; and a time point at which film formation of the electromechanical transducer film 32 with a desired film thickness on the lower electrode 31 is completed is the end.

As a first example, there is a method in which a process of forming a PZT coating film by applying the PZT precursor solution to the lower electrode 31 (or to the PZT coated film after performing drying, thermal decomposition, or crystallization) (S101) is repeatedly performed at any timing after each of the process of drying (S102), the process of thermal decomposition (S103), and the process of crystallization (S104).

For example, only the process of forming the PZT coating film (S101) and the process of drying the PZT coating film (S102) are repeated a predetermined number of times to laminate the PZT coating films (the arrow (a) in FIG. 4). Then, at any timing, thermal decomposition (S103) may be performed, and crystallization (S104) may be performed. After that, depending on a case, the process may further return to the process of forming the PZT coating film (S101) and the drying process (S102), and film formation may be repeated to laminate films (the arrow (c) in FIG. 4).

As a modified example, a process for forming the PZT coating film (S101), the drying process (S102), and the thermal decomposition process (S103) are repeated a predetermined number of times to laminate the PZT coating films (the arrow (b) in FIG. 4). Then, at any timing, crystallization (S104) may be performed. After that, depending on a case, the process may further return to the process of forming the PZT coating film (S101), the drying process (S102), and the thermal decomposition process (S103); and film formation may be repeated to laminate films (the arrow (c) in FIG. 4).

As a second example, the process of forming the PZT coating film (S101), the drying process (S102), the thermal decomposition process (S103), and the crystallization (S104) are repeatedly performed in this order to laminate the PZT coating films (the arrow (c) in FIG. 4). The above-described process is repeated until the film thickness of the PZT film becomes a predetermined thickness. By this method, the PZT film can be formed to have a thickness up to approximately 10 μm.

Figure 5:
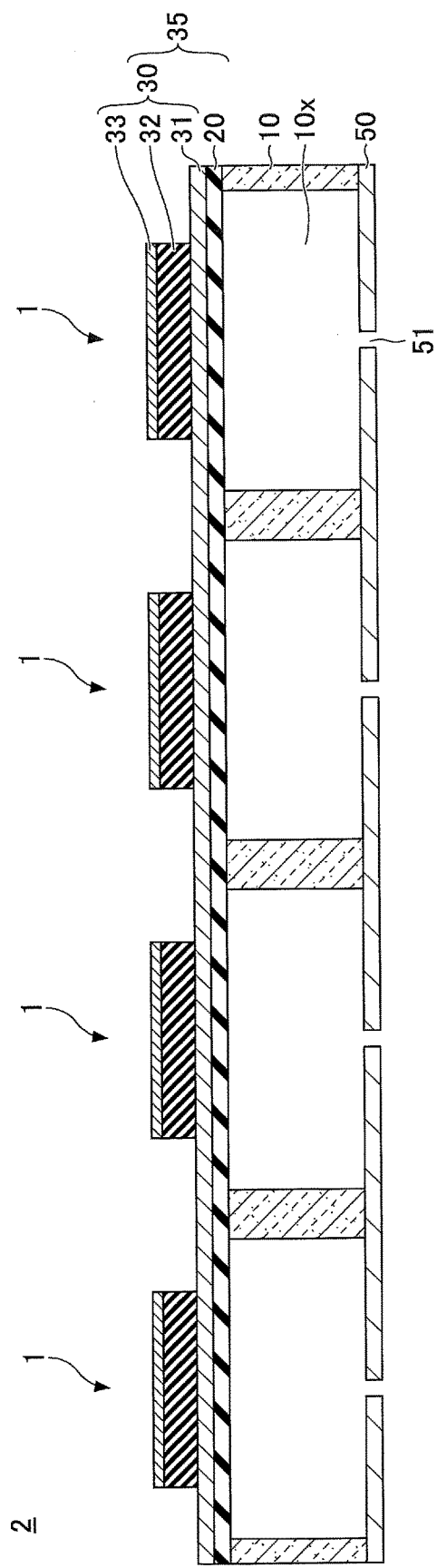
FIG. 5 is a cross-sectional (version 2) view exemplifying the liquid discharge head according to the embodiment.

In FIG. 1, only a single liquid discharge head 1 is illustrated. Actually, as illustrated in FIG. 5, a liquid discharge head 2 is manufactured in which a plurality of liquid discharge heads 1 are arranged in a predetermined direction.

The liquid discharge head 2 includes a discharge driving unit 35 in which a plurality of electromechanical transducer elements 30 are arranged on the oscillation plate 20; the nozzles 51 for discharging a liquid; and the pressure chambers 10x that respectively communicate with the nozzles 51. Here, the nozzles 51 correspond to the electromechanical transducer films 30, respectively. In the liquid discharge head 2, a part of a wall of the pressure chamber 10x is formed of the oscillation plate 20; and the discharge driving unit 35 is for increasing pressure of the liquid inside the pressure chamber 10x.

<Intra-Plane Distribution of the Displacement Characteristic>

Figure 6A:
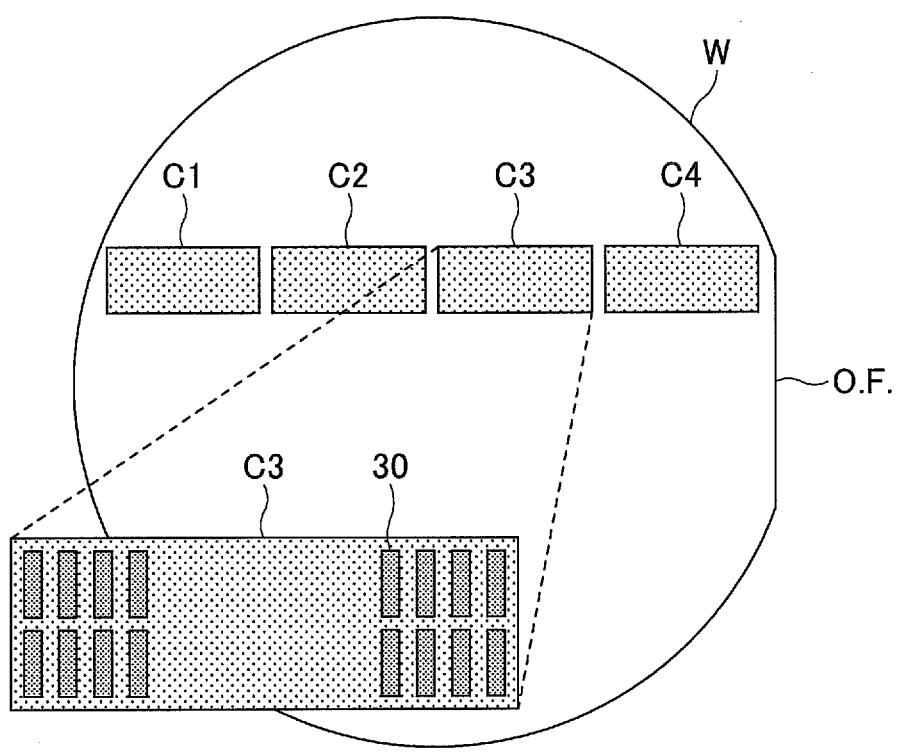
FIGS. 6A and 6B are diagrams illustrating an intra-plane distribution of a displacement characteristic.
Figure 6B:
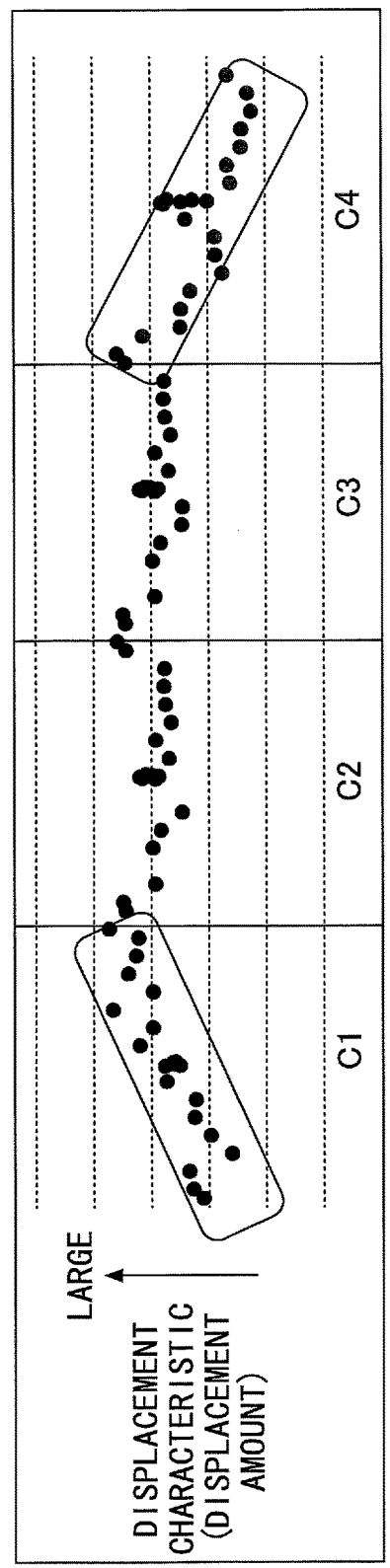

Next, the displacement characteristic (displacement amount) of the electromechanical transducer element 30 is described. FIGS. 6A and 6B are diagrams illustrating displacement amounts of chips within a sequence of chips on a wafer. In this example, the PZT film is used as the electromechanical transducer film 32.

FIG. 6A is a plan view of the wafer W. Chips C1 and C4 are arranged at an outer side of the wafer W; and chips C2 and C3 are arranged at a center side of the wafer W. In each of the chips C1 through C4, a plurality of electromechanical transducer elements 30 are arranged. Here, O.F. is an abbreviation of "Orientation Flat."

FIG. 6B is a diagram illustrating a variation in the displacement amount of the electromechanical transducer element 30 in an array direction (the direction from the chip C1 toward the chip C4) of the electromechanical transducer elements 30 in the chips C1 through C4.

As illustrated in FIG. 6B, in the chips C1 through C4, there is a tendency that the displacement amount decreases toward the outer periphery. Namely, the displacement amounts of the chips C1 and C4 at the outer peripheral side of the wafer W tend to be smaller compared to the displacement amounts of the chips C2 and C3 at the center side of the waver W.

As described above, the fact that the displacement amount (the displacement characteristic) of the electromechanical transducer element 30 differs between the center side and the outer peripheral side (end portion) of the wafer W is said to be the "intra-plane distribution of the displacement characteristic." Here, the oscillation plate 20 deforms in accordance with deformation of the electromechanical transducer element 30. Thus, the "intra-plane distribution of the displacement characteristic" of the electromechanical transducer element 30 may be said to be the "intra-plane distribution of the displacement characteristic" of the oscillation plate 20.

The "intra-plane distribution of the displacement characteristic" significantly affects an ink discharge amount and a discharge rate at a time of discharging ink, so that the "intra-plane distribution of the displacement characteristic" can be clearly recognized as a difference in quality when actually printed on a paper surface. During assembly of the discharge head, by selecting only chips located at the center of the wafer, a failure head in which the discharging performance is significantly varied can be prevented from being manufactured. However, this method may not be favorable. Considering a yield rate of chips located at the outer peripheral portion of the wafer, failures occur corresponding to the number of the electromechanical transducer elements 30 at the outer peripheral portion. Thus, to select only chips at the center of the wafer can be a cause of a large cost increase when the total process is considered.

Furthermore, for the liquid discharge head 2 that is formed of a chip located at the outer peripheral side of the wafer, the variations in the ink discharge amount and the discharge rate at a time of discharging ink can be corrected, for example, by adjusting a voltage waveform at the time of discharging. However, this method may not be favorable. A liquid discharge head 2 formed of a chip located at the center of the wafer coexists. Consequently, in a liquid discharge device including a plurality of liquid discharge heads 2, it may be required to prepare a plurality of waveforms, which can be a factor of significantly increasing the cost for the liquid discharge device.

Therefore, it is important to suppress the "intra-plane distribution of the displacement characteristic." The inventors obtained, by the XRD (X-ray diffraction), a relationship between crystallinity and a piezoelectric property (displacement amount) of the PZT film for a case where the PZT film is used as the electromechanical transducer film 32; and the inventors evaluated the tendency within a wafer surface. As a result, it has been found that, for the so-called tetragonal composition in a range from PZT(49/51) through PZT(51/49), while more favorable displacement characteristic can be obtained (i.e., the displacement amount increases), as a tetragonal property is enhanced, the intra-plane distribution of the displacement characteristic is enlarged (i.e., the yield rate is lowered).

In other words, in the heating process for crystallization, the heating process with an appropriate heat (temperature) history has been applied to the PZT crystal forming the PZT film at the central portion of the wafer. In this case, the appropriate heating process has been applied to the PZT crystal, so that the PZT crystal has the original crystal structure, and exhibits a sufficient piezoelectric property. In the heating process for crystallization, at the end portion of the wafer, the heating process with a heat (temperature) history that is different from the heat history of the central portion tends to be applied. Unlike the central portion, as a result that the heating process with the appropriate heat history has not been applied to the end portion of the wafer, the original crystal structure of the PZT crystal may not be obtained; and the piezoelectric property of the PZT crystal is degraded. It is considered that, as a result, the intra-plane distribution of the displacement characteristic is enlarged (the yield rate is lowered).

This implies that, the more the film forming condition is improved so that the crystal structure of the PZT film becomes closer to the original crystal structure (to enhance crystallinity) so as to enhance the piezoelectric property, the more significant the intra-plane distribution of the displacement characteristic becomes.

Namely, as the process is improved so as to enhance the crystallinity, the crystallinity is enhanced. At the portion at which the crystallinity is enhanced, the piezoelectric property is enhanced. However, a slight process variation, such as a slight difference in the heat history between the central portion and the outer peripheral portion of the wafer in the above-described heating process for crystallization, can be a cause of significant deterioration/variation of crystallinity. Then, the intra-plane distribution of the displacement characteristic is enlarged, resulting in an increase in variation of the quality and a decrease in a yield rate of the obtained electromechanical transducer element or the obtained liquid discharge head.

Instead of trying to improve the crystallinity only by aiming at improving the piezoelectric property, the inventors have come up with an idea of introducing a factor to inhibit crystallization in the film formation process of the PZT film so as not to form the original crystal structure to the extent that the piezoelectric property is not extremely lowered. Then, the inventors have studied how to reduce the intra-plane distribution of the displacement characteristic to homogenize the intra-plane piezoelectric property; how to suppress the variation in quality of the obtained electromechanical transducer element or the liquid discharge head; and how to increase the yield rate.

More specifically, the inventors have studied whether the intra-plane piezoelectric property can be homogenized to increase the yield rate by adding a proper amount of an element (impurity) to inhibit crystallization in the PZT precursor solution without changing the PZT composition in the highly pure PZT precursor solution. Here, the element to inhibit crystallization is added to the extent that the piezoelectric property is not extremely reduced, and quality requirements for the obtained electromechanical transducer element or the liquid discharge head can be met.

As a result, it turns out that by introducing the factor to inhibit crystallization in the film formation process of the PZT film, tough the displacement amount becomes smaller as a whole, the intra-plane distribution of the displacement characteristic (the gradient of the displacement characteristic) tends to be smaller.

More specifically, it turns out that, when a component to be PZT by crystallization is dissolved in a solvent, and when an element that inhibits crystal growth of PZT is added to the solvent within a suitable concentration range, the intra-plane distribution of the displacement characteristic (the gradient of the displacement characteristic) tends to be smaller. Furthermore, it has been found that, as the element to inhibit crystal growth, at least one of chlorine, sulfur, and hafnium is preferable.

<PZT Precursor Solution and the Method for Producing the PZT Precursor Solution>

Next, a PZT precursor solution and a method for producing the PZT precursor solution are described. Here, a factor to inhibit crystallization is introduced in the film formation process of the PZT film.

Figure 7:
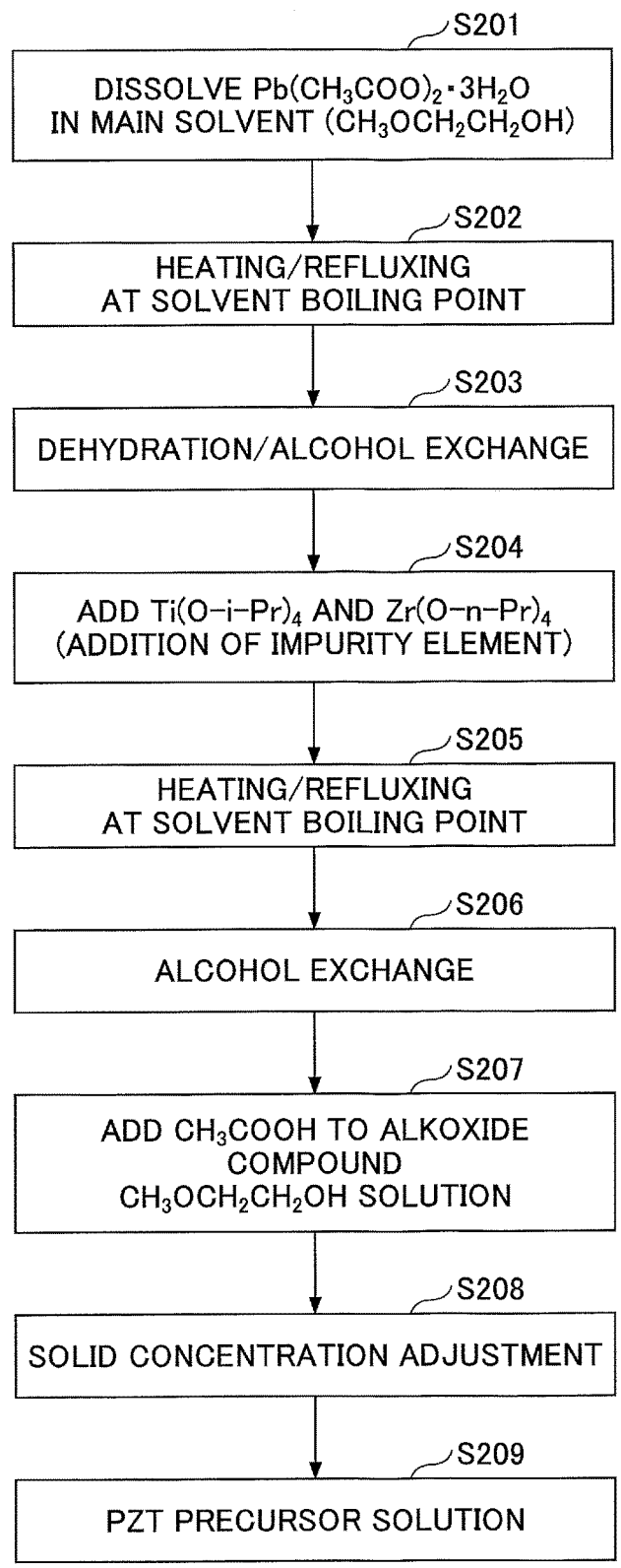
FIG. 7 is a diagram illustrating synthesis of a PZT precursor solution according to the embodiment.

FIG. 7 is a diagram illustrating the synthesis of the PZT precursor solution according to the embodiment. As the component to be PZT by crystallization, for example, lead carboxylate, zirconium alkoxide compound, and titanium alkoxide compound are used. Specifically, as a starting material, for example, lead acetate trihydrate $Pb(CH_3COO)_2 \cdot 3H_2O$ powder (purity 99.5%), 1-propanol solution of zirconium tetra-normal propoxide $Zr(OCH_2CH_2CH_3)_4$ (zirconium tetra-normal propoxide, purity 70%), and titanium tetraisopropoxide $Ti[OCH(CH_3)_2]_4$ (purity 99.5%) may be used.

It is preferable that the starting material be weighted so that the composition is in excess of an amount of lead by 10 mol % with respect to a stoichiometric composition represented by a range from $Pb(Zr_{0.49}Ti_{0.51})O_3$ through $Pb(Zr_{0.51}Ti_{0.49})$, which is generally represented by a range from PZT(49/51) through PZT(51/49), to compensate for escaping of lead during the crystallization process. The $Pb(Zr_{0.49}Ti_{0.51})O_3$ through $Pb(Zr_{0.51}Ti_{0.49})$ tend to form tetragonal crystals in a vicinity of the Morphotoropic Phase Boundary (MPB) composition of the PZT having a favorable piezoelectric property. Note that the MPB is a phase boundary between a tetragonal crystal and a rhombohedral crystal.

After weighting, first, lead acetate trihydrate is dissolved in 2-methoxyethanol $CH_3OCH_2CH_2OH$, as the main solvent (S201). Then, at a temperature of the solution that is greater than or equal to the boiling point of the solvent (e.g., about 120° C.), heating and refluxing are performed for 18 hours (S202), for example. Next, dehydration of the hydrate and exchange reaction of acetate group of lead acetate and alcohol group of 2-methoxyethanol are progressed (S203).

Subsequently, zirconium tetra-normal propoxide/1-propanol solution and titanium tetraisopropoxide are added to the 2-methoxyethanol solution of lead acetate to which the dehydration process and the alcohol-exchange process are applied (S204). Then, at a temperature of the solution that is greater than or equal to the boiling point of the solvent (e.g., about 120° C.), heating and refluxing are performed for 18 hours (S205), for example. Then, the alcohol exchange reaction, the esterification, and the polycondensation reaction are progressed; and ester, which is a by-product, is removed (S206).

Next, an alkoxide compound is dissolved in a 2-methoxyethanol solution; and a very small amount (for example, corresponding to 2.5 vol %) of acetic acid $CH_3COOH$ is added as a stabilizer for preventing hydrolysis of the metal alkoxide (S207). After that, the solid content concentration is adjusted (S208); and the PZT precursor solution is obtained (S209). At step S208, the solid content concentration may be adjusted to be 0.5 mol/L, for example. However, the solid content concentration is not limited to this.

As described above, by introducing a factor to inhibit crystallization in the film formation process of the PZT film, the intra-plane distribution of the displacement characteristic (the gradient of the displacement characteristic) tends to be smaller, though the displacement amount becomes smaller, as a whole. Thus, in the embodiment, the component to be PZT by crystallization is dissolved in the solvent; and, further, an element (impurity element) that inhibits crystal growth of PZT is added to the solvent. The element that inhibits crystal growth may be at least one of chlorine, sulfur, and hafnium. The element that inhibits crystal growth may be introduced from the zirconium alkoxide compound material at step S204, for example.

For example, a case is considered where chlorine is added as an element that inhibits crystal growth. In this case, for example, for the zirconium tetra-normal propoxide/1-propanol solution, which is one of the starting materials of the PZT precursor solution, a material is prepared so that the chlorine impurities included in the solution is approximately in a range from 2 ppm through 5000 ppm. Then, the PZT precursor solution can be synthesized. In this case, the chlorine impurity concentration in the PZT precursor solution with a solid content concentration of 0.5 mol/L is approximately in a range from 0.2 ppm through 500 ppm.

When chlorine (ions) is included in the PZT precursor solution, in the drying process of the PZT film formation process, the solvent is dried; and, at the same time, chlorine (ions) bonds with lead (ions) in the PZT precursor solution to form lead chloride. This lead chloride thermally decomposes to form lead oxide (PbO) during the crystallization process of PZT; and, at the same time, the lead chloride releases chlorine gas to inhibit crystallization of PZT. Thus, if an amount of the added chlorine is excessive, the original crystal structure of PZT may not be obtained.

Namely, a sufficient piezoelectric property may not be obtained if an amount of chlorine is excessive. If there is no chlorine, the intra-plane distribution of the displacement characteristic may not be enhanced. For the amount of chlorine to be added, there exists an appropriate range. Accordingly, chlorine is to be added, so that the concentration of chlorine can be controlled to be within a predetermined concentration range. The same applies to the case of adding another element that inhibits crystal growth of PZT.

In the following, through the examples, the effects are described that are obtained by adding the element that inhibits crystal growth while controlling the concentration of the element to be within a predetermined range.

Example 1 (Addition of Chlorine)

By the method described in FIG. 7, a PZT precursor solution with the solid content concentration of approximately 0.5 mol/L was synthesized. During synthesis, chlorine impurities to be the factor to inhibit crystallization of PZT in the crystallization process were added to the zirconium tetra-normal propoxide/1-propanol solution at different concentrations at S204 of FIG. 7, and a large number of PZT precursor solutions with different chlorine impurity concentrations were synthesized. Then, by the method described in FIGS. 2A through 2D and FIGS. 3A through 3C, PZT films were formed as the electromechanical transducer films 32 by using the PZT precursor solutions, respectively. After that, the liquid discharge heads 2 illustrated in FIG. 5 were manufactured.

Next, using the manufactured liquid discharge heads 2, as an evaluation of electrical characteristics, an average displacement amount at the central portion of the oscillation plate 20 and the intra-plane distribution of the displacement characteristic of the oscillation plate 20 (the amount of inclination of the average displacement amount) were measured. Specifically, a sine wave with a voltage of 15 Vpp was repeatedly applied between the lower electrode 31 and the upper electrode 33 of the electromechanical transducer element 30 at a frequency of 10 kHz, and the displacement amount at the central portion of the oscillation plate 20 was measured 512 times. Then, an average displacement amount which was an average value of these measured values was calculated. The displacement amount was measured by using a laser Doppler speed mater manufactured by Ono Sokki Co. Ltd. The results are shown in FIGS. 8A and 8B.

Figure 8A:
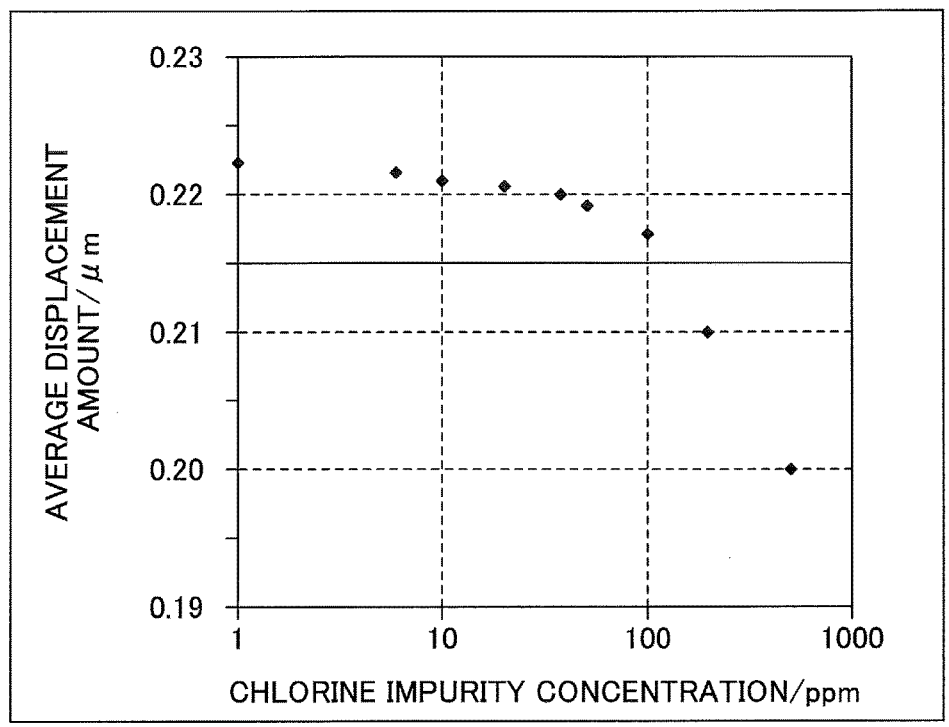
FIGS. 8A and 8B are diagrams illustrating a result of example 1.
Figure 8B:
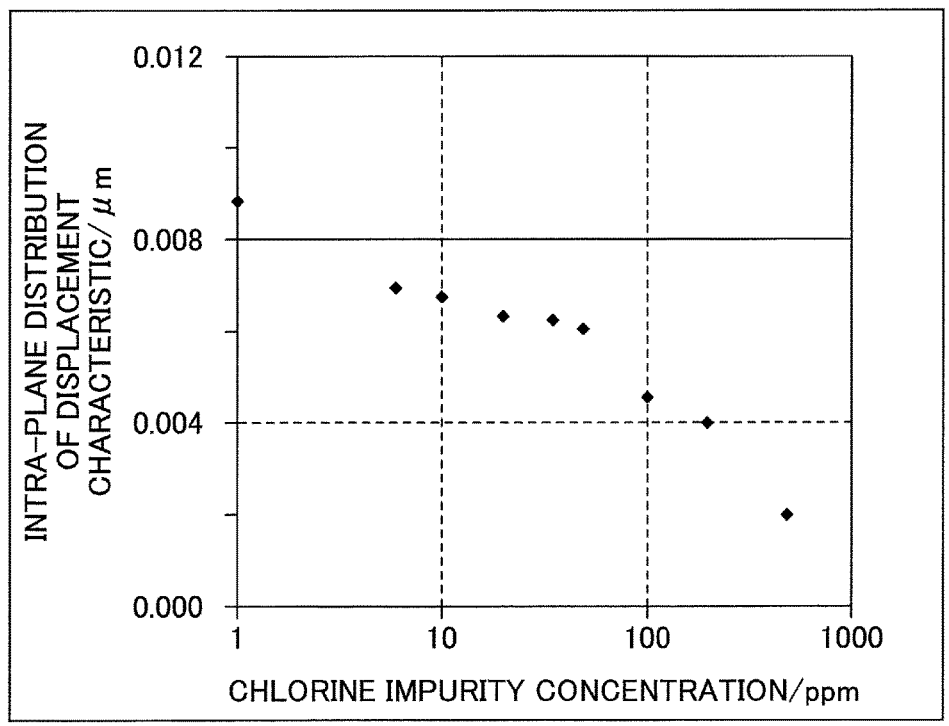

FIG. 8A shows the relationship between the chlorine impurity concentration in the PZT precursor solution and the average displacement amount of the oscillation plate 20 in the liquid discharge head 2, which is manufactured by forming a PZT film, as the electromechanical transducer film 32, by using the PZT precursor solution. In FIG. 8A, the vertical axis represents the average displacement amount of the central portion of the oscillation plate 20 at the time of applying the voltage, and the unit of the vertical axis is μm. The horizontal (lateral) axis represents the chlorine impurity concentration (in logarithmic scale) in the used PZT precursor solution, and the unit of the horizontal axis is mass ppm (which is simply referred to as "ppm," hereinafter).

From FIG. 8A, it can be seen that, as the amount of added chlorine increases, the average displacement amount decreases. Based on the results of studies of an inkjet printer using a liquid discharge head according to related art, it has been known that, in order to stably discharge ink, the average displacement amount is required to be greater than or equal to 0.215 μm (a requirement specification). From the required specification of the average displacement amount and FIG. 8A, it can be said that the chlorine concentration is required to be less than or equal to 100 ppm.

Note that the chlorine concentration in the zirconium tetra-normal propoxide/1-propanol solution, as the starting material, which is used for synthesizing the PZT precursor solution with the chlorine concentration of less than or equal to 100 ppm, is less than or equal to 1000 ppm, in general.

FIG. 8B shows the relationship between the chlorine impurity concentration in the PZT precursor solution and the intra-plane distribution of the displacement characteristic (an amount of inclination of the displacement amount) of the oscillation plate 20 in the liquid discharge head 2, which is manufactured by forming a PZT film, as the electromechanical transducer film 32, by using the PZT precursor solution. The degree of integration of the electromechanical transducer element 30 (the oscillation plate 20) in the evaluated liquid discharge head 2 was 300 npi (nozzle per inch).

In FIG. 8B, the vertical axis represents the intra-plane distribution of the displacement characteristic, and the unit of the vertical axis is μm. Specifically, the average displacement amounts of the 300 nozzles in the liquid discharge head 2 were plotted in the order of the nozzle numbers. Then, a linear approximation was made for the relationship between the depicted displacement amounts and the nozzle numbers. The intra-plane distribution of the displacement characteristic is the value obtained by calculating the inclination. The horizontal (lateral) axis represents the chlorine impurity concentration (in logarithmic scale) in the used PZT precursor solution, and the unit of the horizontal axis is ppm.

Based on the results of studies of an inkjet printer using a liquid discharge head according to related art, it has been known that, if the intra-plane distribution of the displacement characteristic is less than or equal to 0.008 μm, there is no problem on quality of printing, and favorable image quality can be obtained. From this required specification of the intra-plane distribution of the displacement characteristic and FIG. 8B, it can be said that the chlorine concentration is required to be greater than or equal to 3 ppm.

Namely, by considering the required specification of the average displacement amount (greater than or equal to 0.215 μm) and the required specification of the intra-plane distribution of the displacement characteristic (less than or equal to 0.008 μm), it can be said that the chlorine concentration is required to be greater than or equal to 3 ppm and less than or equal to 100 ppm.

Example 2 (Addition of Sulfur)

By the method described in FIG. 7, a PZT precursor solution with the solid content concentration of approximately 0.5 mol/L was synthesized. During synthesis, sulfur impurities to be the factor to inhibit crystallization of PZT in the crystallization process are added to the zirconium tetra-normal propoxide/1-propanol solution at different concentrations at S204 of FIG. 7, and a large number of PZT precursor solutions with different sulfur impurity concentrations were synthesized. Then, by the method described in FIGS. 2A through 2D and FIGS. 3A through 3C, PZT films were formed as the electromechanical transducer films 32 by using the PZT precursor solutions, respectively. After that, the liquid discharge heads 2 illustrated in FIG. 5 were manufactured. Next, electrical characteristics were evaluated similar to example 1, and the results shown in FIGS. 9A and 9B where obtained.

Figure 9A:
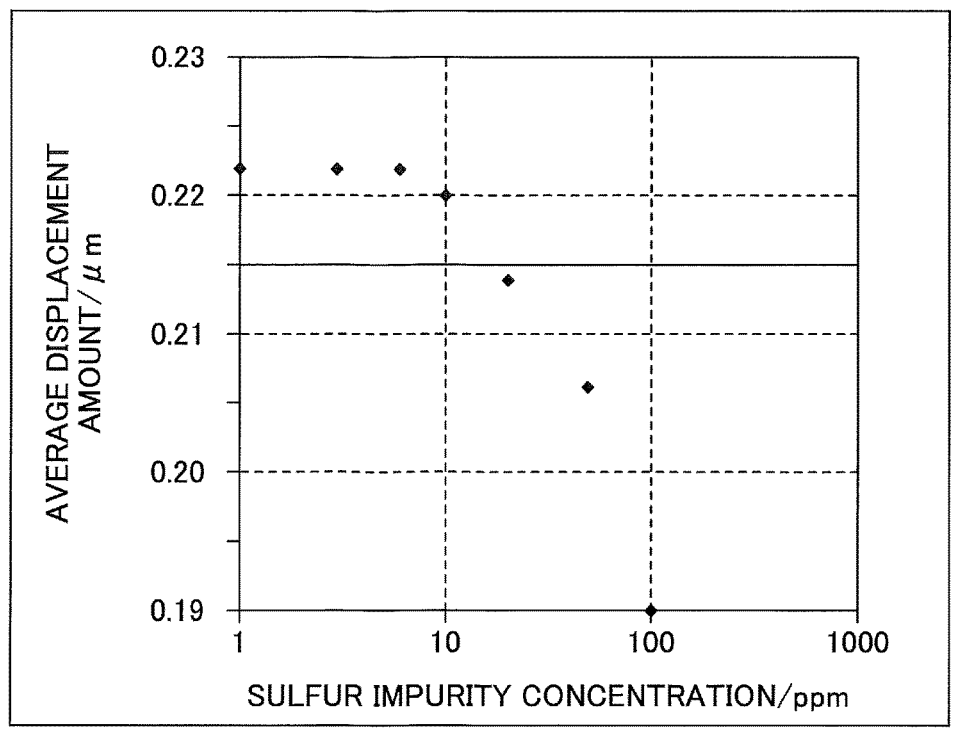
FIGS. 9A and 9B are diagrams illustrating a result of example 2.

From FIG. 9A, it can be seen that, as the amount of added sulfur increases, the average displacement amount decreases. From the required specification of the average displacement amount (greater than or equal to 0.215 μm) and FIG. 9A, it can be said that the sulfur concentration is required to be less than or equal to 10 ppm.

Note that the sulfur concentration in the zirconium tetra-normal propoxide/1-propanol solution as the starting material, which is used for synthesizing the PZT precursor solution with the sulfur concentration of less than or equal to 10 ppm, is less than or equal to 100 ppm, in general.

Figure 9B:
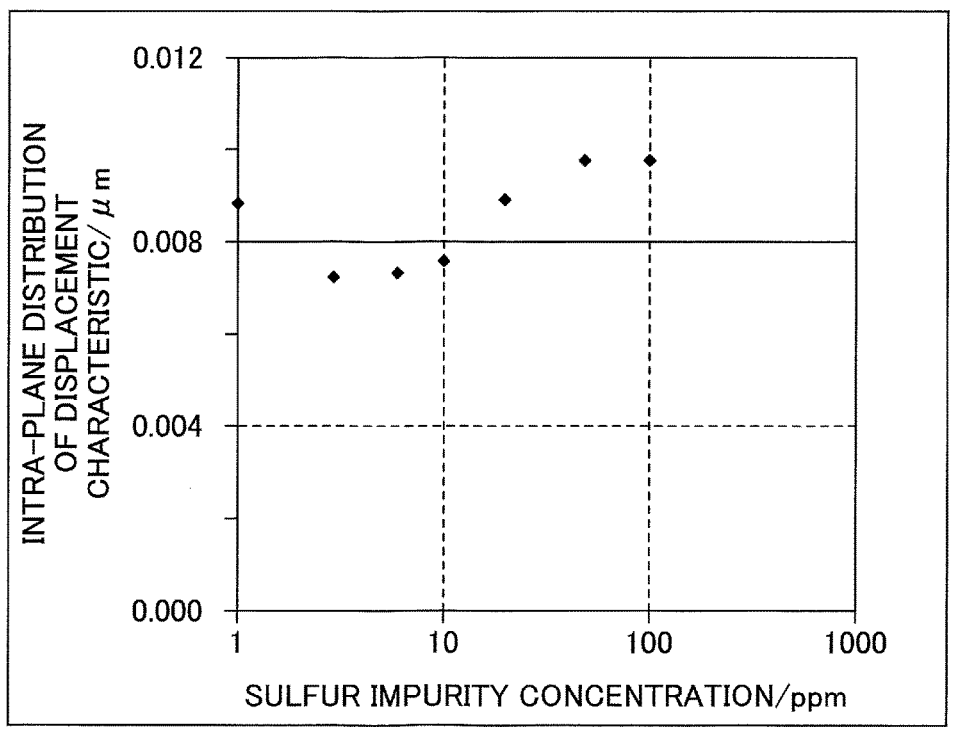

From the required specification of the intra-plane distribution of the displacement characteristic (less than or equal to 0.008 μm) and FIG. 9B, it can be said that the sulfur concentration is required to be greater than or equal to 3 ppm and leas than or equal to 20 ppm.

Namely, by considering the required specification of the average displacement amount (greater than or equal to 0.215 μm) and the required specification of the intra-plane distribution of the displacement characteristic (less than or equal to 0.008 μm), it can be said that the sulfur concentration is required to be greater than or equal to 3 ppm and less than or equal to 10 ppm.

Example 3 (Addition of Hafnium)

By the method described in FIG. 7, a PZT precursor solution with the solid content concentration of approximately 0.5 mol/L was synthesized. During synthesis, hafnium impurities to be the factor to inhibit crystallization of PZT in the crystallization process are added to the zirconium tetra-normal propoxide/1-propanol solution at different concentrations at S204 of FIG. 7, and a large number of PZT precursor solutions with different hafunium impurity concentrations were synthesized. Then, by the method described in FIGS. 2A through 2D and FIGS. 3A through 3C, PZT films were formed as the electromechanical transducer films 32 by using the PZT precursor solutions, respectively. After that, the liquid discharge heads 2 illustrated in FIG. 5 were manufactured. Next, electrical characteristics were evaluated similar to example 1, and the results shown in FIGS. 10A and 10B where obtained.

Figure 10A:
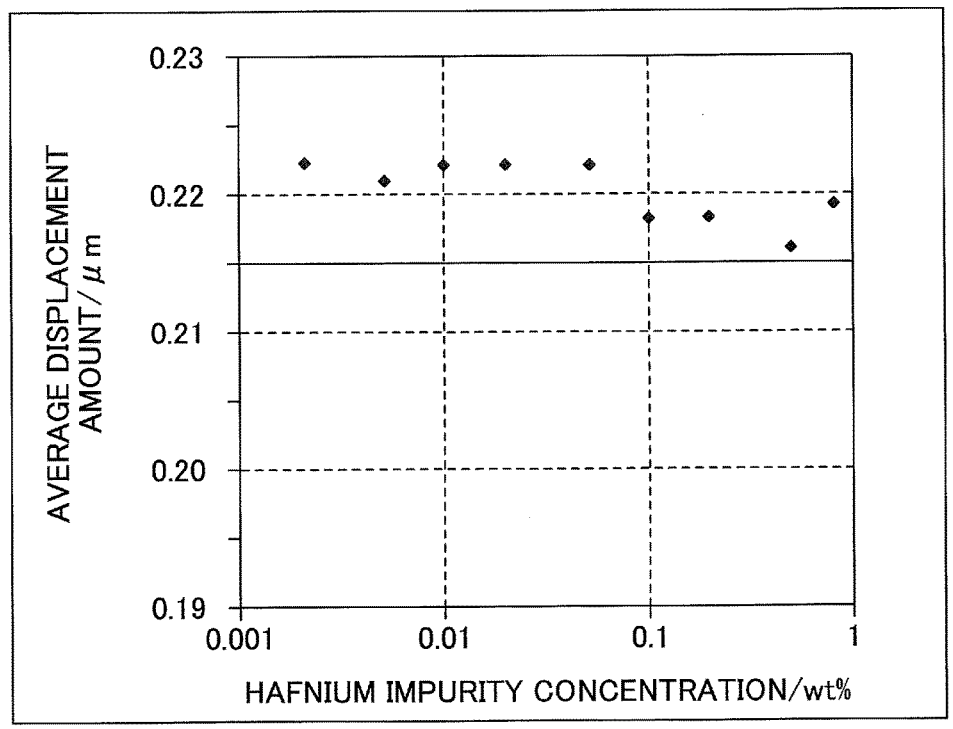
FIGS. 10A and 10B are diagrams illustrating a result of example 3.

From FIG. 10A, it can be seen that there is no clear correlation between the amount of added hafnium and the average displacement amount. There is no restriction on the required specification of the average displacement amount (greater than or equal to 0.215 μm).

Figure 10B:
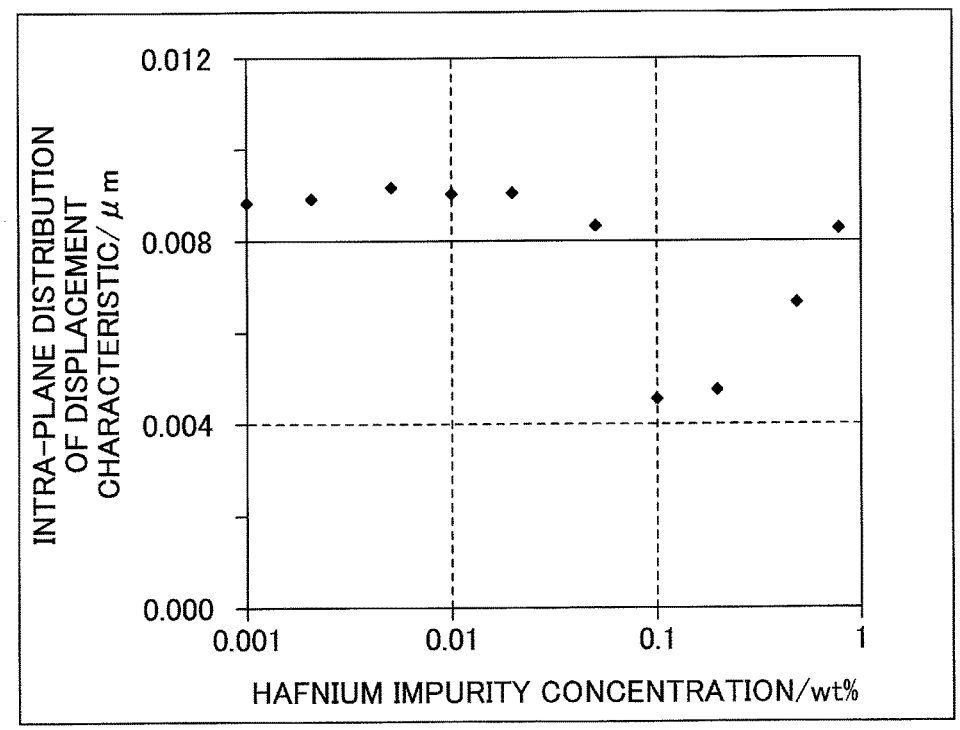

From the required specification of the intra-plane distribution of the displacement characteristic (less than or equal to 0.008 μm) and FIG. 10B, it can be said that the hafnium concentration is required to be greater than or equal to 0.1 wt % and leas than or equal to 0.8 wt %.

Note that the hafnium concentration in the zirconium tetra-normal propoxide/1-propanol solution as the starting material, which is used for synthesizing the PZT precursor solution with the hafnium concentration of greater than or equal to 0.1 wt %, is greater than or equal to 1 wt %, in general. The hafnium concentration in the zirconium tetra-normal propoxide/1-propanol solution as the starting material, which is used for synthesizing the PZT precursor solution with the hafnium concentration of less than or equal to 0.8 wt %, is less than or equal to 8 wt %, in general.

Namely, by considering the required specification of the average displacement amount (greater than or equal to 0.215 μm) and the required specification of the intra-plane distribution of the displacement characteristic (less than or equal to 0.008 μm), it can be said that the hafnium concentration is required to be greater than or equal to 0.1 wt % and less than or equal to 0.8 wt %.

A PZT precursor solution, a method for producing a PZT precursor solution, a method for producing a PZT film, a method for producing an electromechanical transducer film, and a method for producing a liquid discharge head are described by the above-described embodiments. However, the present invention is not limited to the above-described embodiments, and various modifications and improvements may be made within the scope of the present invention.

For example, in the above-described embodiment, a case is described where the upper electrode is the individual electrode and the lower electrode is the common electrode. However, the present invention is not limited to this. Namely, with a configuration where the upper electrode is the common electrode and the lower electrode is the individual electrode, the similar effect can be obtained.

The present application is based on and claims the benefit of priority of Japanese priority application No. 2016-010941 filed on Jan. 22, 2016, the entire contents of which are hereby incorporated herein by reference.

What is claimed is:

1. A lead zirconate titanate (PZT) precursor solution to be used for forming a PZT film by a sol-gel method, the PZT precursor solution comprising:
    a solvent;
    a component that forms PZT by crystallization, the component being dissolved in the solvent; and
    an element that inhibits crystal growth of PZT, the element being dissolved in the solvent.

2. The PZT precursor solution according to claim 1, wherein the element contains at least one of chlorine, sulfur, and hafnium.

3. A method for producing a lead zirconate titanate (PZT) film, the method comprising:
    forming a coating film by applying a PZT precursor solution including a solvent, a component that forms PZT by crystallization, the component being dissolved in the solvent, and an element that inhibits crystal growth of PZT, the element being dissolved in the solvent;
    forming an amorphous film by heating the coating film at a predetermined temperature; and
    forming the PZT film by heating a multilayer amorphous film obtained by repeating the forming of the coating film and the forming of the amorphous film a first predetermined number of times at a temperature higher than the predetermined temperature to crystalize the multilayer amorphous film.

4. The method for producing the PZT film according to claim 3, further comprising:
    thickening the crystalized PZT film by repeating the forming of the crystalized PZT film a second predetermined number of times.

5. A method for producing an electromechanical transducer element, the method comprising:
    forming a lower electrode;
    forming a lead zirconate titanate (PZT) film as an electromechanical transducer film on the lower electrode by the method for producing the PZT film according to claim 3; and
    forming an upper electrode on the PZT film.

6. A method for producing a liquid discharge head, the method comprising:
    forming an oscillation plate on a substrate;
    forming an electromechanical transducer element on the oscillation plate by the method for producing the electromechanical transducer element according to claim 5;
    forming a pressure chamber in the substrate; and
    bonding the substrate to a nozzle plate.

7. A method for producing a lead zirconate titanate (PZT) precursor solution to be used for forming a PZT film by a sol-gel method, the method comprising:
    dissolving a component that forms PZT by crystallization in a solvent; and
    adding an element that inhibits crystal growth of PZT to the solvent.

8. The method according to claim 7, wherein the element is added to the solvent while a concentration of the element is controlled to be within a predetermined concentration range.

9. The method according to claim 7, wherein the element is at least one of chlorine, sulfur, and hafnium.

10. The method according to claim 7, wherein the component that forms PCT by crystallization includes lead carboxylate, a zirconium alkoxide compound, and a titanium alkoxide compound, and
    wherein the element is introduced through the zirconium alkoxide compound.

* * * * *